(12) United States Patent
Ha et al.

(10) Patent No.: US 10,964,745 B2
(45) Date of Patent: Mar. 30, 2021

(54) PHOTO DETECTING APPARATUS AND METHOD OF MANUFACTURING THE SAME

(71) Applicant: LG DISPLAY CO., LTD., Seoul (KR)

(72) Inventors: Sungbong Ha, Daegu (KR); DaeKyu Kim, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 280 days.

(21) Appl. No.: 16/123,616

(22) Filed: Sep. 6, 2018

(65) Prior Publication Data
US 2019/0103436 A1   Apr. 4, 2019

(30) Foreign Application Priority Data
Sep. 29, 2017 (KR) .................. 10-2017-0127179

(51) Int. Cl.
*H01L 27/146* (2006.01)
*G01T 1/20* (2006.01)

(52) U.S. Cl.
CPC ...... *H01L 27/14663* (2013.01); *G01T 1/2006* (2013.01); *H01L 27/14603* (2013.01); *H01L 27/14612* (2013.01); *H01L 27/14689* (2013.01); *H01L 27/14692* (2013.01)

(58) Field of Classification Search
CPC ......... H01L 27/14663; H01L 27/14603; H01L 27/14692; H01L 27/14612; H01L 27/14889; G01T 1/2006

USPC ..................... 257/447, 443, 444; 438/48, 66
See application file for complete search history.

(56) References Cited

U.S. PATENT DOCUMENTS

| 5,262,649 A * | 11/1993 | Antonuk et al. ........................ H01L 27/14609 250/370.09 |
| 2011/0180889 A1 | 7/2011 | Jung et al. |
| 2013/0032723 A1* | 2/2013 | Lee et al. .......... H01L 27/14676 250/369 |
| 2015/0123119 A1 | 5/2015 | Sekine et al. |

FOREIGN PATENT DOCUMENTS

EP   2919269 A2   9/2015

* cited by examiner

*Primary Examiner* — Thinh T Nguyen
(74) *Attorney, Agent, or Firm* — Birch, Stewart, Kolasch & Birch, LLP

(57) ABSTRACT

Provided is a photo detecting apparatus. The photo detecting apparatus includes a thin film transistor array on a first surface of a substrate having a specific light transmissivity and a photo diode structure between the first surface and the thin film transistor array. The photo diode structure is implemented to receive and process an electromagnetic radiation through a second surface of the substrate.

15 Claims, 15 Drawing Sheets

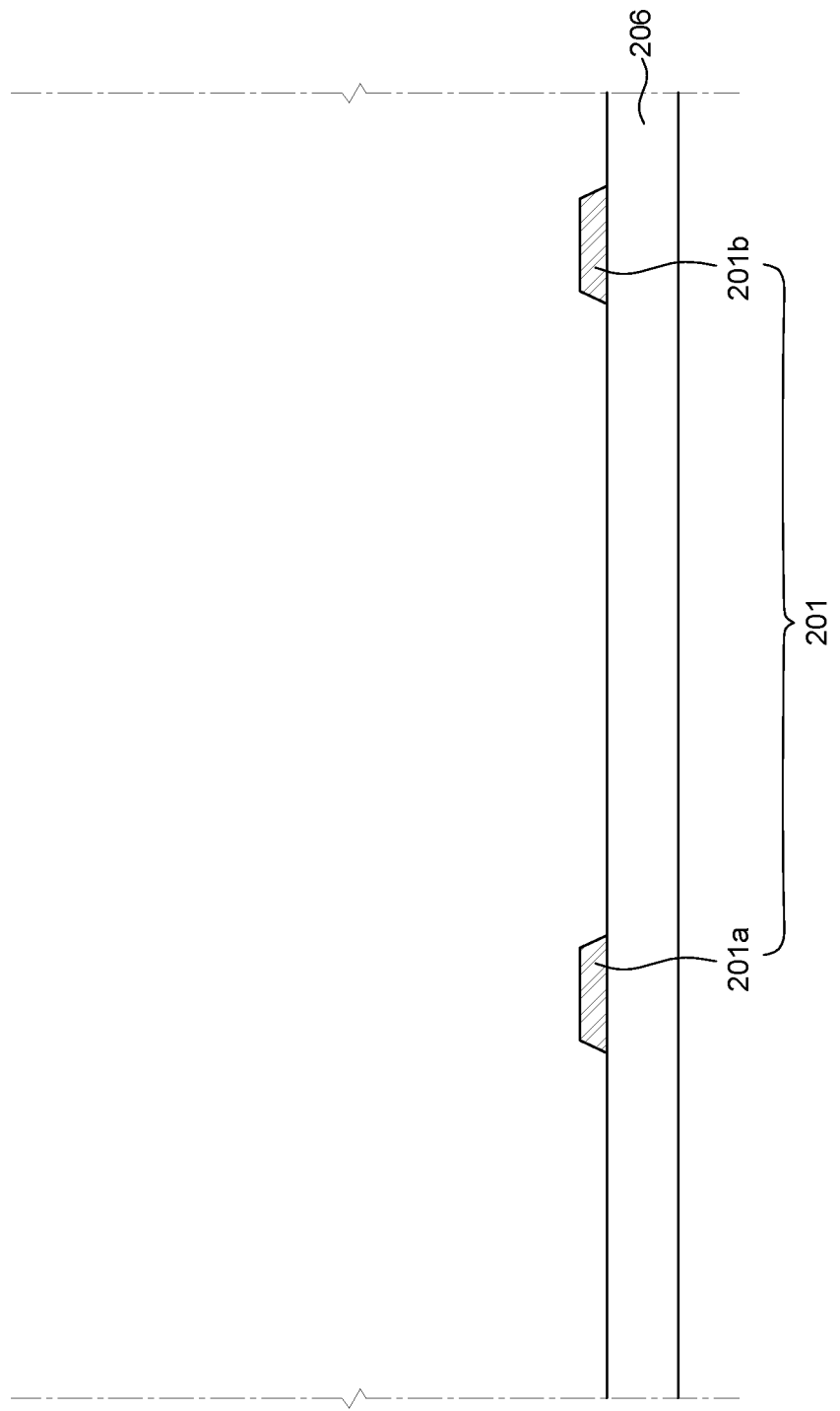

US 10,964,745 B2

PHOTO DETECTING APPARATUS AND METHOD OF MANUFACTURING THE SAME

CROSS-REFERENCE TO RELATED APPLICATION

This application claims the priority of Korean Patent Application No. 10-2017-0127179 filed on Sep. 29, 2017, in the Korean Intellectual Property Office, the disclosure of which is incorporated herein by reference.

BACKGROUND OF THE INVENTION

Field of the Invention

The present disclosure relates to a photo detecting apparatus, and more particularly, to a photo detecting apparatus which increases a quantum efficiency and simplifies the process and a manufacturing method thereof.

Description of the Related Art

Radiations refer to light or particles which have the property of extending in all directions at any point. Among them, there is a radiation which generates internal energy change by an ionization reaction caused when a strong energy is received from the outside, which is called ionizing radiation. Various ionizing radiations in nature have unique wavelengths and among them, X-ray is a representative ionizing radiation having a high energy level due to a short wavelength.

In the modern society, X-rays are utilized in various devices. The devices are basically configured such that an X-ray is generated to pass through an object and then a degree of transmission is figured out by a detector. There are two types of photo detecting apparatuses.

First, in a direct type photo detecting apparatus, a photo converting material such as selenium or silicon converts an X-ray which passes through an analysis material into electrons and then a panel detects the electrons to read information. In contrast, in an indirect type photo detecting apparatus, a scintillator including a photo converting material such as cesium iodide converts an X-ray which passes through an analysis material into a visible ray, a photo diode or a complementary metal oxide semiconductor (CMOS) sensor converts the visible ray into electrons and then a panel detects an electric signal to read information. Specifically, since the indirect type photo detecting apparatus can be operated at a low voltage, it can be manufactured to be a portable type. Further, the indirect type photo detecting apparatus has less radiation exposure so that it is getting the spotlight in medical and industrial fields.

FIG. 1 is a view illustrating a part of a photo detecting apparatus of the related art. FIG. 2 is a cross-sectional view taken along the line I-I' of FIG. 1.

Referring to FIGS. 1 and 2, a photo detecting apparatus 100 of the related art is configured such that a metal film is deposited on a substrate 106 and a gate electrode 160a is formed according to a mask process along with a line 160b corresponding to the gate electrode 160a. A gate pad and a lead-out pad can be simultaneously formed at this time.

When the gate electrode 160a is formed on the substrate 106, a gate insulating layer 103 is formed on an entire surface of the substrate 106, and an amorphous silicon film and a doped amorphous silicon film are sequentially formed, and then an active layer 150 is formed on the gate insulating layer 103 above the gate electrode 160a by the mask process.

When the active layer 150 is formed, source/drain metal films are formed on the substrate 106 and the mask process is performed to form source/drain electrodes 140a and 140b.

Thereafter, a first interlayer insulating layer 102 is formed on the substrate 106 and then a contact hole process is performed to open the drain electrode 140b. Thereafter, after forming a metal film on the substrate, a second electrode 130 is formed on the pixel region according to the mask process. The second electrode 130 is in electrical contact with the drain electrode 140b through a contact hole. For example, the second electrode 130 can use any one metal material selected from molybdenum (Mo), aluminum (Al), and an alloy thereof.

Next, after sequentially forming a photo conductive layer and a metal layer on the second electrode 130, the mask process is performed to form a first electrode 110 from the metal layer first. Thereafter, the mask process is additionally performed to complete a photo diode 120 from the photo conductive layer between the second electrode 130 and the first electrode 110. For example, the first electrode 110 can use any one of transparent indium tin oxide (ITO), indium zinc oxide (IZO), and indium tin zinc oxide (ITZO).

As described above, when the photo diode 120 is formed in the pixel region, a second interlayer insulating layer 105 is formed on the entire area of the substrate 106 and then performs a contact hole process to open the source electrode 140a region, the second electrode 130 region, the gate pad region, and the lead-out pad region according to the mask process.

Next, after forming the metal layer on the substrate, a bias line 101 having first, second and third parts 101a, 101b and 101c is formed according to the mask process.

As described above, when the bias line 101 is formed on the substrate 106, the second interlayer insulating layer 105 corresponding to the pixel region is removed to form an open region through which a part of the first electrode 110 is exposed.

Next, a protecting layer 104 is formed above the substrate 106.

FIG. 3 is a view illustrating an additional component added to the photo detecting apparatus of FIG. 1 and incidence of an external ray.

Referring to FIG. 3, in the photo detecting apparatus of the related art, a planarization layer 107 is formed above the substrate 106 on which the protecting layer 104 is formed as illustrated in FIG. 1 to enable the planarization.

Next, when the planarization layer 107 is formed on the substrate 106, a phosphor 170 having a fluorescent material which is capable of converting the X-ray into a visible ray is formed above the substrate 106.

In this instance, the external ray such as an X-ray is emitted from an external light source 300 to be incident into the photo detecting apparatus and the incident external ray sequentially passes through components such as the phosphor 170, the planarization layer 107, the protecting layer 104, the second interlayer insulating layer 105, and the first electrode to be irradiated onto the photo diode 120.

Referring to FIG. 1, according to the above description, an area where the external ray is incident to reach the photo diode 120 can be represented by an incident region 190 having first and second portions 190a and 190b.

Here, as a numerical value representing an external ray incident efficiency of the photo detecting apparatus, there is a fill factor which is defined by dividing an area of the photo diode which receives the external ray by the entire area of the substrate onto which the external ray is incident. In the above photo detecting apparatus, when the entire area of the substrate 106 onto which the external ray is incident is the same, if the incident region 190 is increased, the numerical value of the fill factor is increased. Therefore, in order to increase the numerical value of the fill factor, it is required to change positions and areas of the components of the photo detecting apparatus.

SUMMARY OF THE INVENTION

In order to improve a performance, a quality, and a productivity of a photo detecting apparatus, it is necessary to increase a fill factor, improve a quantum efficiency, and simplify the process. Therefore, the inventors have derived a structure for minimizing a structure which hinders the incidence of the external ray. Specifically, the inventors invented a photo detecting apparatus in which a thin film transistor including a gate electrode, an active layer, and source/drain electrodes is disposed below a photo diode to maximize light incidence onto the photo diode. The present disclosure provides a substrate for an X-ray detector and a manufacturing method which satisfy a desired fill factor, reduce a failure, and simplify the process in a photo-diode based photo detecting apparatus invented by the inventors.

Objects of the present disclosure are not limited to the above-mentioned objects, and other objects, which are not mentioned above, can be clearly understood by those skilled in the art from the following descriptions.

According to the photo detecting apparatus according to various example embodiments of the present disclosure, a production efficiency is increased through an increased fill factor, an improved quantum efficiency, and a simplified process as compared with the related art. The photo detecting apparatus can include a substrate, a photo diode, a thin film transistor, and a phosphor. The thin film transistor can include a gate electrode, a drain electrode, and a source electrode.

In the photo detecting apparatus according to the example embodiment of the present disclosure, a photo diode is disposed between the substrate and the thin film transistor and the external ray is incident below the substrate, which is different from the related art in which the thin film transistor is disposed between the substrate and the photo diode and the external ray is incident above the substrate. In the photo detecting apparatus according to the example embodiment, as compared with the related art, the arrangement of the photo diode and the change in an area of the photo diode are relatively free and the components which hinder the incidence of the external ray onto the photo diode are reduced so that the incident area is increased and the fill factor is improved. Further, the structure of the components is changed to improve the quantum efficiency as compared with the related art and the number of mask processes is reduced to increase production efficiency.

Further, in the photo detecting apparatus according to another example embodiment of the present disclosure, a phosphor is added below the substrate in the photo detecting apparatus according to one example embodiment. Therefore, as compared with the related art in which a planarization layer is provided to provide the phosphor above the substrate, the planarization layer does not need to be disposed so that the processes can be simplified.

Other detailed matters of the example embodiments are included in the detailed description and the drawings.

Exemplary embodiments of the present disclosure can provide a photo detecting apparatus which increases a fill factor, maximizes quantum efficiency, lowers a process difficulty, and simplifies the process by changing a structure of the component as compared with the related art and a manufacturing method thereof.

The effects according to example embodiments of the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIG. 7A to 7I are cross-sectional views illustrating a manufacturing method of a photo detecting apparatus according to an example embodiment of the present disclosure.

DETAILED DESCRIPTION OF THE EMBODIMENTS

Figure 1:
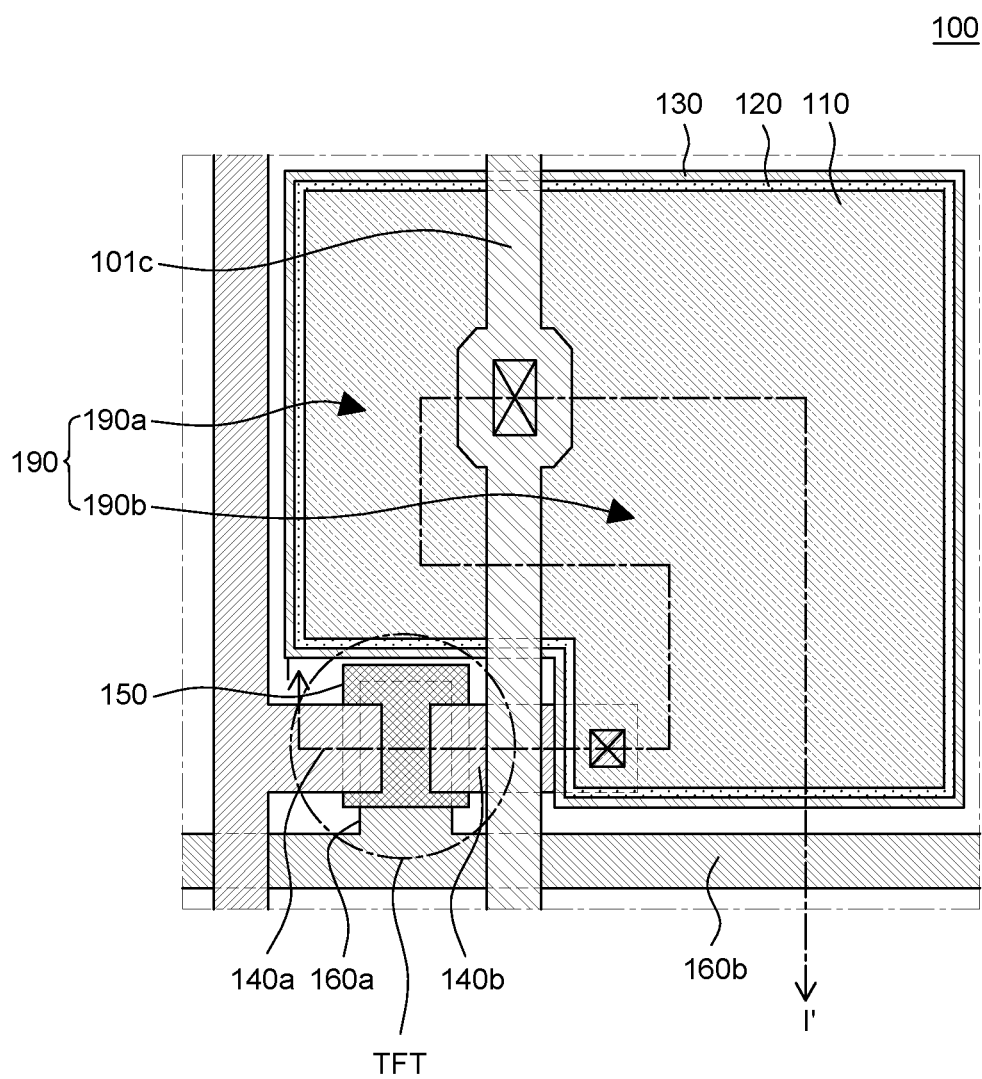
FIG. 1 is a plan view illustrating a part of a photo detecting apparatus according to a related art.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a photo detecting apparatus according to example embodiments of the present disclosure will be described in detail with reference to accompanying drawings.

Figure 2:
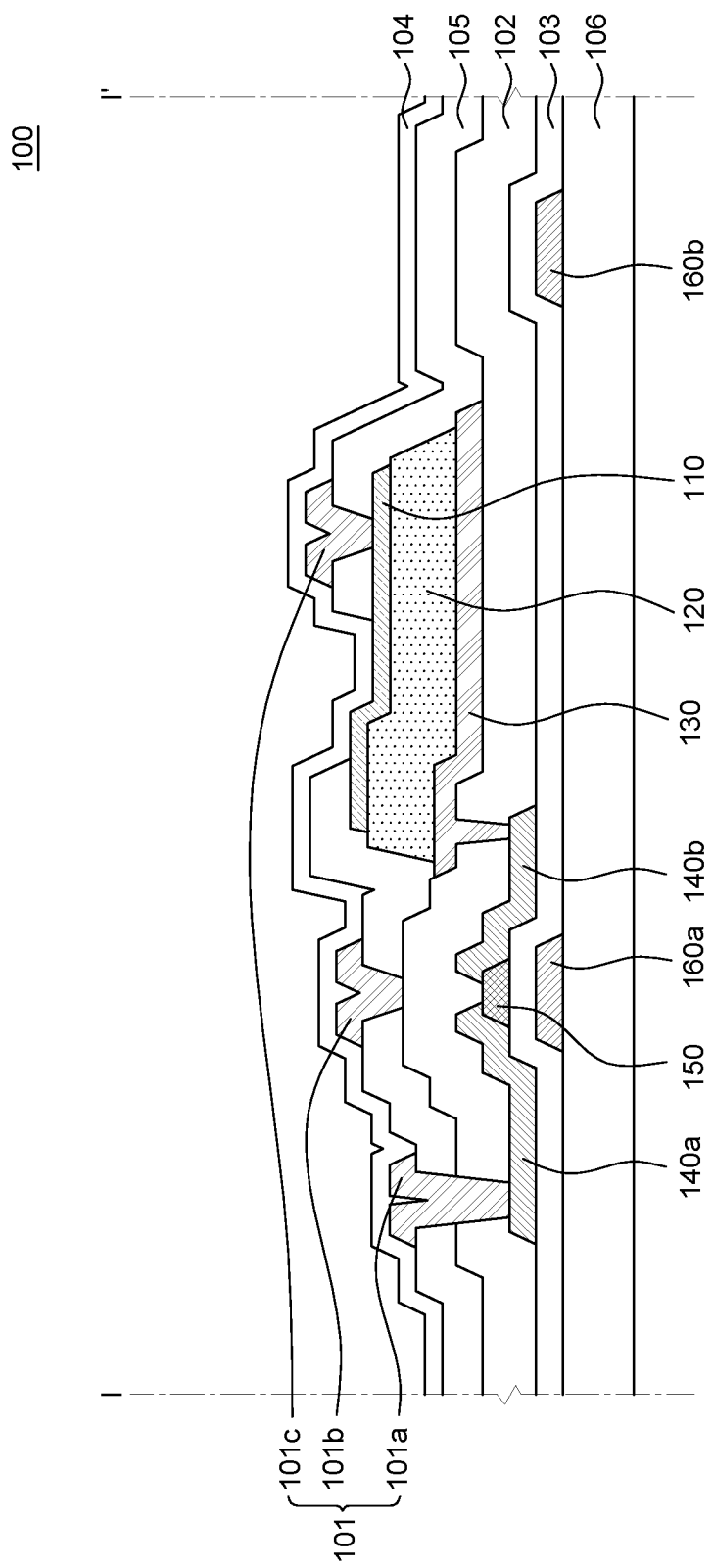
FIG. 2 is a cross-sectional view taken along the line I-I' of FIG. 1 of the related art.
Figure 3:
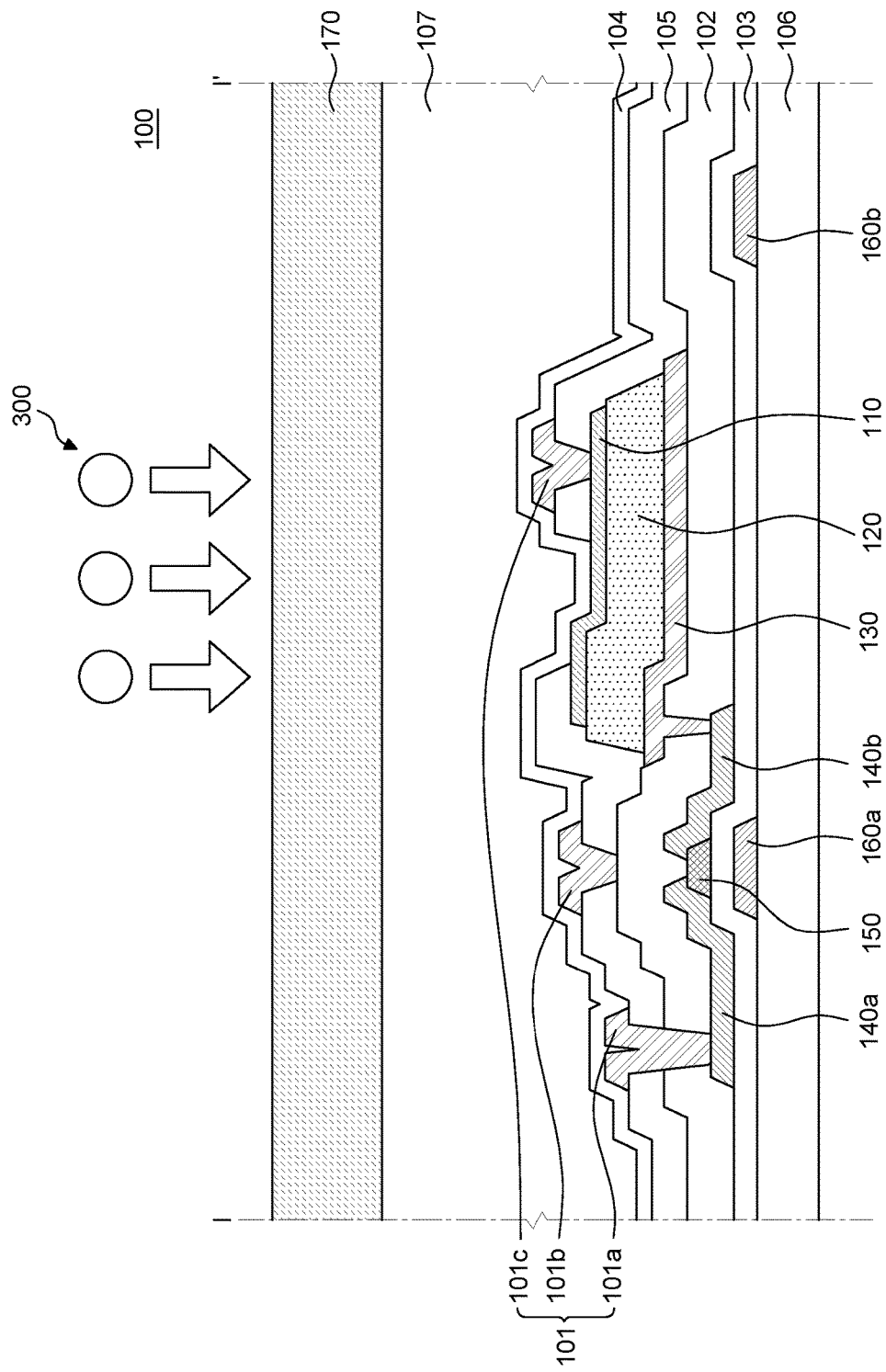
FIG. 3 is a cross-sectional view illustrating incidence of an external ray after adding a planarization layer and a phosphor in the photo detecting apparatus according to the related art as shown in FIG. 2.

The photo detecting apparatus according to the related art illustrated in FIGS. 1 to 3 has a structure in which a photo diode is disposed above the thin film transistor (TFT) and incidence of the external ray is performed through an upper portion of the substrate so that a fill factor of approximately 60% can be obtained due to hindrance of incidence of the external ray by the thin film transistor and the bias line.

However, in order to obtain a higher fill factor and improved quantum efficiency, it is required to increase an area of the photo diode, rearrange components which hinder the incidence of the external ray, and change a structure of the photo diode. However, the photo detecting apparatus according to the related art cannot overcome a fundamental limit of the structure.

Specifically, referring to FIG. 2 which illustrates a photo detecting apparatus of the related art, a photo diode 120 needs to be electrically connected to a thin film transistor which is formed of source/drain electrodes 140a and 140b and a gate electrode 160a through a contact hole of a second electrode 130 disposed below the photo diode 120. Due to such a structure, in the photo diode 120, the thin film transistor should be located in a part of a lower surface and thus there is a limitation in increasing the area of the photo diode 120 and rearranging the photo diode 120.

Further, one or more components are disposed in a part of a lower surface of the photo diode 120, so that the photo diode 120 is minutely bent so that the photo diode need not be disposed to be parallel to the substrate 106. The curved photo diode 120 can cause a leakage current, which affects the quantum efficiency.

Further, when a taper angle of the contact hole of the second electrode 130 is minutely changed, it can affect the quantum efficiency of the photo diode 120.

The bias line 101 with a third part 101c disposed above the photo diode 120 hinders the incidence of the external ray to the photo diode 120, which can lower a fill factor of the photo detecting apparatus.

During the manufacturing process, when in the photo detecting apparatus of the related art, the thin film transistor is disposed on the substrate and the photo diode 120 is disposed thereon, not an overall deposition process, but a partial deposition process is required and a plurality of photolithographic processes (mask processes) is necessary. Here, the photolithographic process is a series of processes of transferring a pattern drawn on a mask onto a substrate on which a thin film is deposited to form a desired pattern and includes a plurality of processes such as application, exposure, and development of a photoresist. However, the plurality of photolithographic processes lowers a production yield. Specifically, a mask designed to form a pattern is very expensive so that when the number of masks applied to the processes is increased, the manufacturing cost of the photo detecting apparatus is proportionally increased.

Further, in the photo detecting apparatus of the related art, a plurality of additional processes, such as two processes of disposing interlayer insulating layers, and a process of providing a contact hole of the second electrode 130 below the photo diode 120, is required.

Referring to FIG. 3 which illustrates a photo detecting apparatus of the related art, due to a characteristic of the phosphor 170 which can be disposed only in a flat location, before bonding the phosphor 170, a process of disposing a planarization layer 107 to planarize one surface of the substrate 106 is additionally required.

Figure 4:
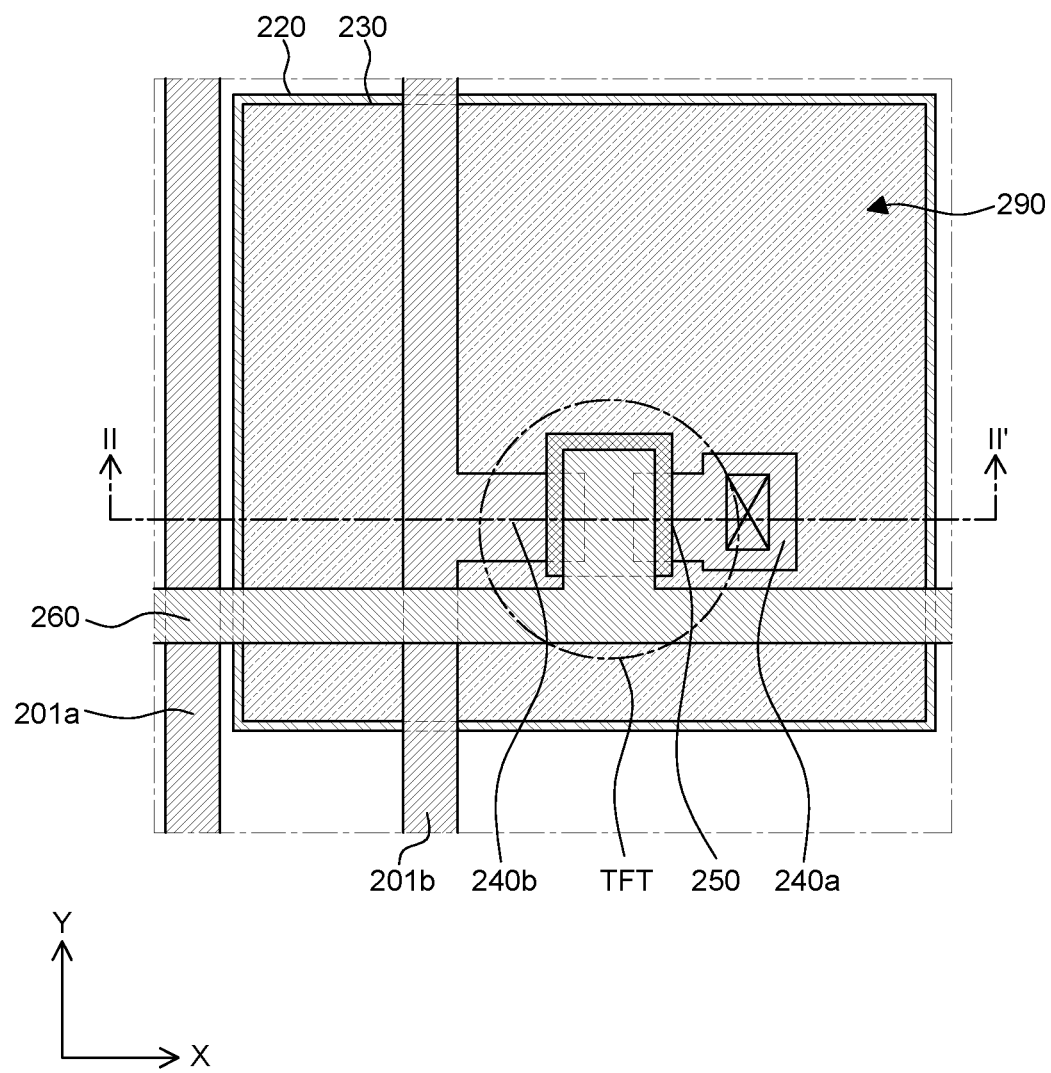
FIG. 4 is a plan view illustrating a part of a photo detecting apparatus according to an example embodiment of the present disclosure.
Figure 5:
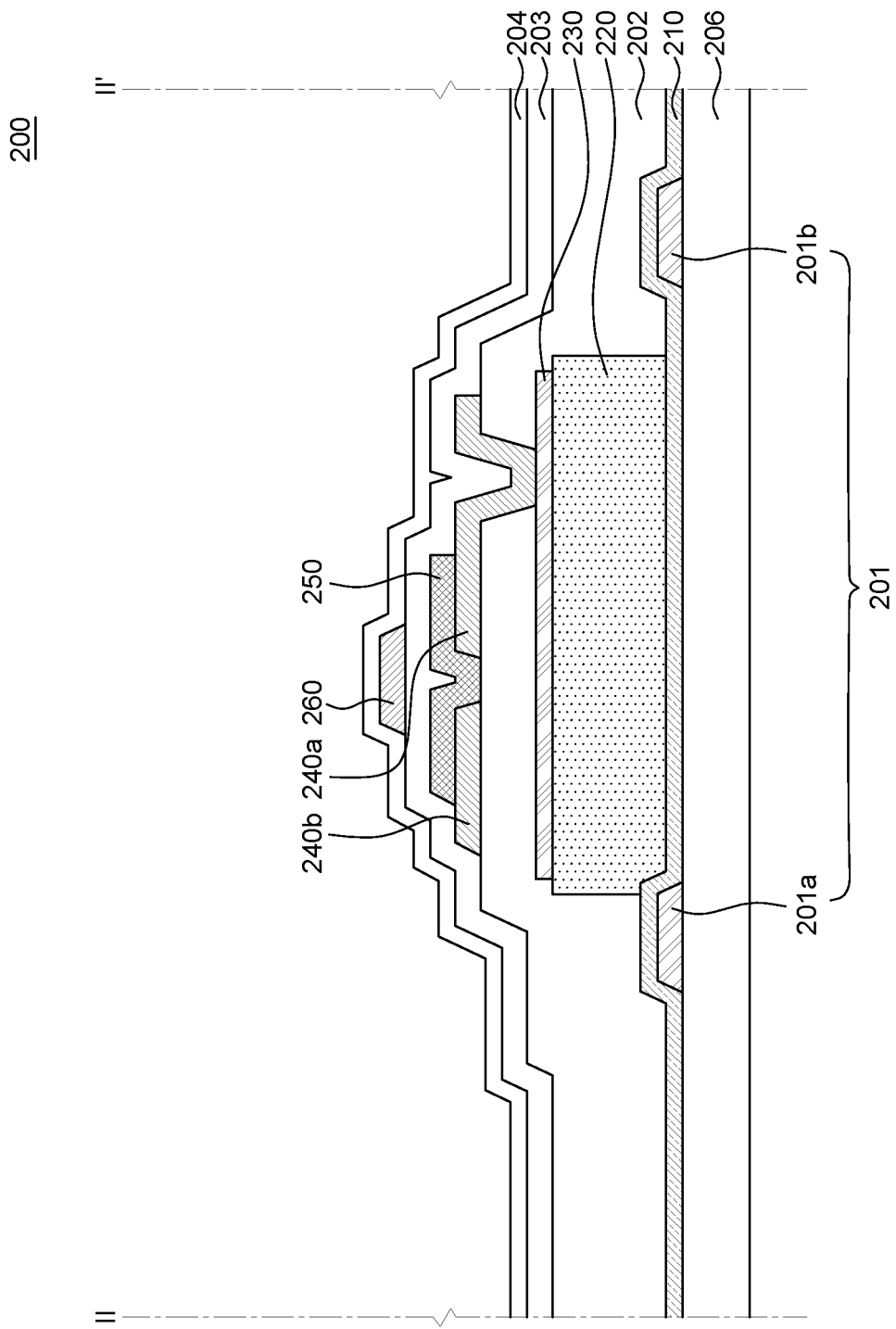
FIG. 5 is a cross-sectional view taken along the line II-II' of FIG. 4 according to the example embodiment of the present disclosure.

FIGS. 4 and 5 are views illustrating a photo reaction element of a photo detecting apparatus according to an example embodiment of the present disclosure. Specifically, FIG. 5 is a cross-section view of a photo reaction element of a photo detecting apparatus according to the example embodiment of the present disclosure which is taken along line II-II' of FIG. 4. All the components of a photo reaction element and a photo detecting apparatus according to all embodiments may operationally coupled and configured. In all embodiments of the present disclosure, when one element is discussed, it means there can be a plurality of the elements in the embodiments of the present disclosure.

A photo detecting apparatus according to an example embodiment of the present disclosure can be driven in response to various electromagnetic radiations. A photo detecting apparatus according to the example embodiment of the present disclosure which can be driven in response to an X-ray among the electromagnetic radiations can be referred to as an X-ray detector.

Referring to FIG. 4, the photo detecting apparatus 200 according to the example embodiment of the present disclosure includes a bias line 201a (or a first bias line 201a, when a second bias line 201b of bias lines 201 is present) which traverses a plane of the substrate 206, a photo diode 220, a second electrode 230 disposed in a region of the photo diode 220, and a thin film transistor (TFT) including a source electrode 240b, a drain electrode 240a, an active layer 250, and a gate electrode 260 disposed in the region of the second electrode 230. Accordingly, there can be a plurality of the bias lines 201a, the bias lines 201b, the photo diodes 220, the second electrodes 230, the thin film transistors (TFT), the source electrodes 240b, the drain electrodes 240a, the active layers 250, and the gate electrodes 260, for example.

As illustrated in FIG. 4, an incident region 290 can be an area obtained by excluding an area where the bias line 201a can be disposed from an area represented by one surface of the photo diode 220 provided on the substrate 206. The incident region 290 can be affected only by the area of the bias line 201a regardless of other components disposed on the substrate 206.

Referring to FIG. 5, when an external ray is incident onto the substrate 206, if one surface where the photo diode 220 can be located is referred to as a first surface of the substrate 206, the external ray can be incident onto a second surface which can be opposite to the first surface.

In this instance, the incident external ray can be various electromagnetic radiations including a visible ray and an X-ray.

The substrate 206 can be located on an optical path where the external ray is incident onto the photo diode 220 and can be configured by a transmissive member to minimize hindrance of the incidence of the external ray due to light absorption and reflection of the substrate 206.

The bias line 201a transmits a driving voltage to the plurality of pixels. The bias line 201a can transmit a predetermined voltage to the photo diode 220 or selectively transmit a reverse bias or a forward bias to the photo diode 220. The bias line 201a extends in a y direction in FIG. 4 and can be formed to be electrically connected to the photo diode 220 through the first electrode 210. Further, the bias line 201a can be formed to be electrically connected to a plurality of other photo diodes which are not illustrated in the drawing, through the first electrode 210.

The first electrode 210 can be a cathode and can be disposed on an entire surface of the substrate 206. Therefore, differently from the related art, there can be a process advantage in that a photolithographic process (mask process) is not required.

Further, the first electrode 210 can be located on an optical path where the external ray can be incident onto the photo diode 220. Therefore, the first electrode 210 can be formed of a transparent conductive material such as indium tin oxide (ITO), indium zinc oxide (IZO), and indium tin zinc oxide (ITZO) so that the external ray is easily incident onto the photo diode 220. Other materials can be used.

In other words, it can be considered that the first electrode 210 can be located on the first surface of the substrate 206 and the bias line 201 can be located between the first electrode 210 and the substrate 206.

Further, after disposing the bias line 201 on the first surface of the substrate 206, the first electrode 210 can be provided on the entire first surface of the substrate 206. Therefore, when the entire first surface of the substrate 206 excluding an area where the bias line 201 can be provided can be referred to as a first area, it can be considered that the first electrode 210 can be provided on the first area and a surface area of the bias line 201 excluding the first area.

As compared with the related art, according to the above-described structure, the first electrode 210 does not have a contact hole so that the quantum efficiency of the photo detecting apparatus can be eventually increased.

Referring to FIG. 5, the photo diode 220 can be located between the first electrode 210 and the thin film transistor. The photo diode 220 causes a photo reaction with respect to the external ray which is incident below the substrate 206. Such a photo reaction converts the incident visible ray into an electrical signal and collects the electrical signal to transmit the electrical signal to a lead-out circuit.

The photo diode 220 can be configured to be parallel to the substrate 206 without being bent. Here, when the photo diode 220 can be parallel to the substrate 206 without being bent, it means that a specific component which can be disposed below the photo diode 220 is not provided in a part of a lower surface of the photo diode 220, but can be provided on the entire surface of the photo diode 220 so that the photo diode 220 does not have a minute curve due to a specific component disposed therebelow. Here, the specific component can include the first electrode 210.

As compared with the related art, the structure according to example embodiments of the present disclosure can suppress the leakage current through the absence of the bent surface and ultimately increase the quantum efficiency of the photo detecting apparatus.

Further, the photo diode 220 can be provided to be in direct contact with the first electrode 210 on the entire surface.

Furthermore, the photo diode 220 has a reduced number of components located therebelow as compared with the related art, so that an option of selection of arrangements and changes of areas can be increased. Further, since the thin film transistor is not provided below the photo diode 220, the photo diode 220 can be formed on the entire surface of the substrate.

Referring to FIG. 4, the photo diode 220 can be disposed in a region excluding a region where the bias line 201a can be disposed. However, the arrangement of the photo diode 220 is not limited to the arrangement of FIG. 4 and the photo diode can be disposed so as to maximize the incident region 290, thereby obtaining the highest fill factor.

The photo diode 220 can form a group together with a plurality of other photo diodes which are not illustrated in the drawing to form a photo diode structure. The photo diode structure can be a set of the photo diode 220 and a plurality of other photo diodes so that the structure can have the entire characteristic of the photo diode 220.

Further, the photo diode 220 can be a specific detector which outputs an electrical signal in response to the external ray and the photo diode of the photo detecting apparatus of the related art is referred to as a normal detector.

The second electrode 230 can be disposed on the entire surface of the photo diode 220. The second electrode 230 can be an anode and can be formed to have the same area as or a smaller area than that of the photo diode 220. For example, the second electrode 230 can use any one metal material selected from molybdenum (Mo), aluminum (Al), copper (Cu), and an alloy thereof. Other materials can be used.

Further, the second electrode 230 can be used for electrical conduction between the photo diode 220 and the thin film transistor. The second electrode according to the related art is electrically connected to the thin film transistor through a contact hole for electrical conduction. However, differently from the related art, according to the example embodiment of the present disclosure, the second electrode can be disposed on an upper surface of the photo diode 220 to be parallel to the substrate.

Here, when the second electrode 230 is disposed in parallel, it means that the photo diode 220 can be disposed in parallel without being bent. In other words, it means that a specific component which can be disposed below the second electrode 230 is not disposed on a part of a lower surface of the second electrode 230, but can be disposed on the entire surface of the second electrode 230 so that the second electrode 230 does not have a minute curve due to the specific component disposed therebelow.

The specific component can include at least one of the photo diode 220 and the first electrode 210.

Further, the second electrode 230 can be disposed on an upper surface of the photo diode 220 and can be disposed on a lower surface of the thin film transistor so that it can be said that the second electrode can be disposed between the photo diode 220 and the thin film transistor.

The interlayer insulating layer 202 can be formed to cover the first electrode 210, the photo diode 220, and the second electrode 230 and suppresses conduction of electrons between the photo diode 220 and the thin film transistor to separate the layers. Further, the interlayer insulating layer 202 can be configured by an insulating material, and for example, can be formed of tetraethoxy silane (TEOS) and silicon nitride (SiNx). Other materials can be used.

The thin film transistor includes the source/drain electrodes 240b and 240a, the gate electrode 260, and the active layer 250. The thin film transistor can be disposed on one surface on which the second electrode 230 can be disposed and the interlayer insulating layer 202 can be disposed between the thin film transistor and the second electrode 230.

The thin film transistor can be a normal switch which can be turned on or turned off in accordance with an external signal so that the thin film transistor of the photo detecting apparatus of the related art can be referred to as a normal switch.

Further, the thin film transistor can be electrically connected to the second electrode 230 through a contact hole which can be disposed through the interlayer insulating layer 202. Since the second electrode 230 can be electrically connected to the photo diode 220, the thin film transistor accepts the electrons generated in the photo diode 220 to read information. The signal which can be read for every pixel of the thin film transistor by the above-described method can be digitalized via an analog to digital converter (ADC) to be finally implemented on a monitor as a digital image.

For example, the source/drain electrodes 240b and 240a are formed of aluminum (Al) or an aluminum alloy. Selectively, the source/drain electrodes 240b and 240a can be formed of tungsten (W), molybdenum (Mo), tantalum (Ta), titanium (Ti), copper (Cu), chromium (Cr), cobalt (Co), ruthenium (Ru), niobium (Nb), rhodium (Rh), zirconium (Zr), or an alloy thereof. Other materials can be used.

For example, the active layer 260 can be formed of a semiconductor layer such as amorphous silicon (a-Si). In the active layer 260, an ohmic contact layer for forming an ohmic contact with the source/drain electrodes 240b and 240a can be disposed. The ohmic contact layer can be formed of a highly doped amorphous silicon (n+ a-Si or p+ a-Si). Other materials can be used.

The gate electrode 260 can be disposed on the same surface as the thin film transistor. A gate insulating layer 203 can be disposed between the gate electrode 260 and the thin film transistor. The gate electrode 260 can be electrically connected to the photo diode 220 to control the thin film transistor. In other words, when a voltage which can be higher than a threshold voltage can be applied to the gate electrode 260, the thin film transistor can be turned on.

In FIG. 4, the gate electrode 260 extends in an x-direction and can be electrically connected to a plurality of other photo diodes which is not illustrated in FIG. 4.

For example, the gate electrode 260 can be formed of an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chrome (Cr), titanium (Ti), and tantalum (Ta). Other materials can be used.

The gate insulating layer 203 can be located between the interlayer insulating layer 202 and the protecting layer 204, between the source/drain electrodes 240b and 240a and the protecting layer 204, and between the active layer 250 and the protecting layer 204. For example, the gate insulating layer 203 can be formed of a silicon nitride layer (SiNx), a silicon oxide layer (SiOx), a silicon oxy nitride layer (SiONx), or a combination thereof. Selectively, the gate insulating layer 223 can be formed of a high dielectric constant material such as a hafnium oxide layer ($HfO_2$), an aluminum oxide layer ($Al_2O_3$), a yttrium oxide layer ($Y_2O_3$), and a tantalum oxide layer ($Ta_2O_5$) or a combination thereof. Other materials can be used.

The protecting layer 204 can be formed to cover the gate insulating layer 203 and the gate electrode 260. For example, the protecting layer 204 can be formed of an inorganic material formed of silicon nitride (SiNx) or silicon oxide (SiOx), an organic material having an excellent planarization property and photosensitivity, or a low dielectric constant insulating material such as a-Si:C:O or a-Si:O:F formed by a plasma enhanced chemical vapor deposition (PECVD). Further, the protecting layer 204 can have a dual-layered structure of a lower inorganic layer and an upper organic layer for protecting the exposed thin film transistor while maintaining an excellent characteristic of the organic layer.

Figure 6:
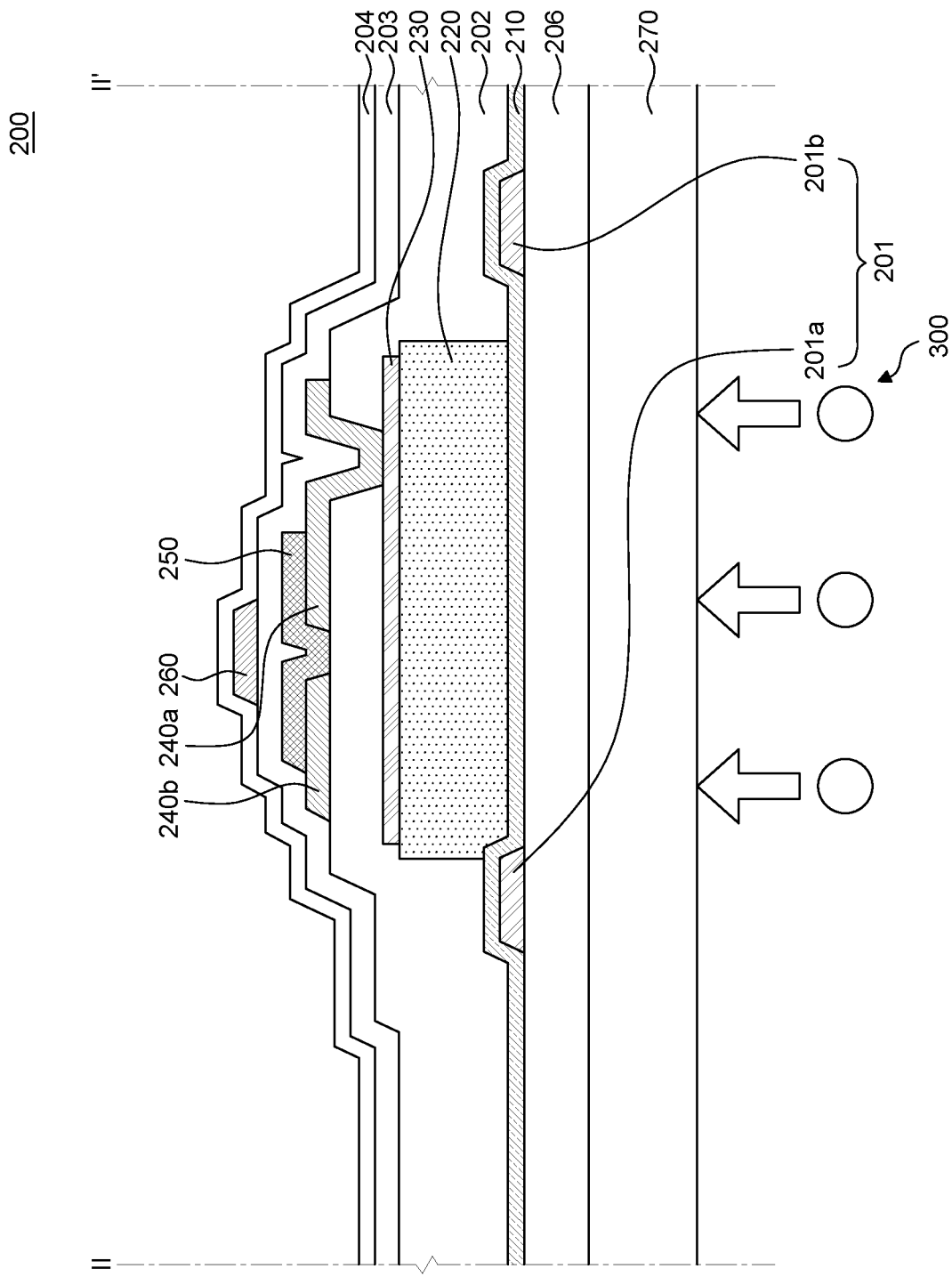
FIG. 6 is a cross-sectional view of another example embodiment of the present disclosure illustrating incidence of an external ray after adding a phosphor in the photo detecting apparatus as shown FIG. 5.

FIG. 6 illustrates another example embodiment of a substrate for an X-ray detector illustrated in FIGS. 4 and 5 and a description of the same contents as the components illustrated in FIGS. 4 and 5 will be omitted below or only briefly described. FIG. 6 illustrates another example embodiment of a substrate for an X-ray detector in which a phosphor 270 can be further provided on a lower surface of the substrate and an external ray can be incident from the external light source 300 located below the substrate as compared with the example embodiment of FIG. 5 illustrating a substrate for an X-ray detector including various components on an upper surface of the substrate.

The phosphor 270 can be provided on a surface which can be different from one surface of the substrate 206 on which the photo diode 220 can be disposed, that is, below the substrate 206. According to the related art, the phosphor can be provided above the substrate to react with the external ray which can be incident onto the substrate. In contrast, in the substrate for an X-ray detector according to the example embodiment of the present disclosure, the external ray can be incident below the substrate 206 so that the phosphor can be provided below the substrate 206.

The phosphor needs to be provided on a component having one flat surface. According to the related art, due to various components which are previously disposed before providing the phosphor, one surface on which the phosphor needs to be provided is not flat so that the planarization layer can be additionally disposed on this surface to make the surface flat. Differently from the related art, according to the example embodiment of the present disclosure, the external ray can be incident below the substrate 206 and thus one surface on which the phosphor 270 needs to be provided can be a lower surface of the substrate 206 having a flat surface so that a process of additionally disposing the planarization layer is not necessary. Accordingly, the planarization layer for the phosphor is excluded.

The phosphor 270 converts the X-ray which enters from the external light source 300 into a ray having a wavelength of approximately 400 nm to 700 nm in a visible ray region and can be referred to as a scintillation layer or a scintillator.

The phosphor 270 includes a fluorescent material which emits a visible ray in response to the X-ray entering from the outside and for example, can be formed of cesium iodide and gadolinium oxysulfide (Gadox).

The external light source 300 emits various rays to enter the ray onto the substrate for an X-ray detector of the present disclosure. The ray is not limited to the X-ray and includes various rays such as a visible ray. When the ray is incident, the ray can be directly incident onto the substrate for an X-ray detector of the present disclosure from the external light source 300 or can be incident after the external ray emitted from the external light source 300 passes through various objects and a wavelength thereof is changed.

The substrate for an X-ray detector according to another example embodiment of the present disclosure can include an anti-scattering layer between the substrate 206 and the phosphor 270. The anti-scattering layer improves a surface roughness and a surface hardness before the external ray incident onto the substrate 206 passes through the substrate 206 and reduces external scattering of light entering from the outside. For example, the anti-scattering layer can use a transparent conductive material such as indium tin oxide (ITO), indium zinc oxide (IZO), and indium tin zinc oxide (ITZO).

Another example embodiment of the present disclosure of FIG. 6 can have an improved fill factor as compared with the related art.

More specifically, in another example embodiment of the present disclosure, the thin film transistor is not provided below the photo diode 220 so that it can be easy to dispose the photo diode 220 and increase the area to increase the incident area. However, the second electrode 230 is not electrically connected to the thin film transistor through a contact hole so that the quantum efficiency is not reduced.

Therefore, another example embodiment of the present disclosure has an improved incident efficiency and an increased fill factor as compared with the photo detecting apparatus of the related art and also has an expanded quantum efficiency.

FIGS. 7A to 7I are cross-sectional views taken along the line I-I' in the photo detecting apparatus illustrated in FIG. 4, which sequentially illustrate a manufacturing process of a photo detecting apparatus.

In the manufacturing process of the photo detecting apparatus, a plurality of photolithographic processes (mask processes) can be applied to a photo detecting apparatus including the thin film transistor so that the number of mask processes required can be reduced in terms of a production efficiency.

As illustrated in FIG. 7A, after forming a first conductive layer on the entire surface of the substrate 206, the first conductive layer can be selectively patterned using a photolithographic process (a first mask process) to form the bias line 201 above the substrate 206.

Here, as the first conductive layer, for example, a low resistance opaque conductive material such as aluminum (Al), an aluminum alloy (Al alloy), tungsten (W), copper (Cu), chromium (Cr), or molybdenum (Mo) can be used. Further, the first conductive layer can be formed to have a multi-layered structure in which two or more low resistance conductive materials are laminated.

Figure 7B:
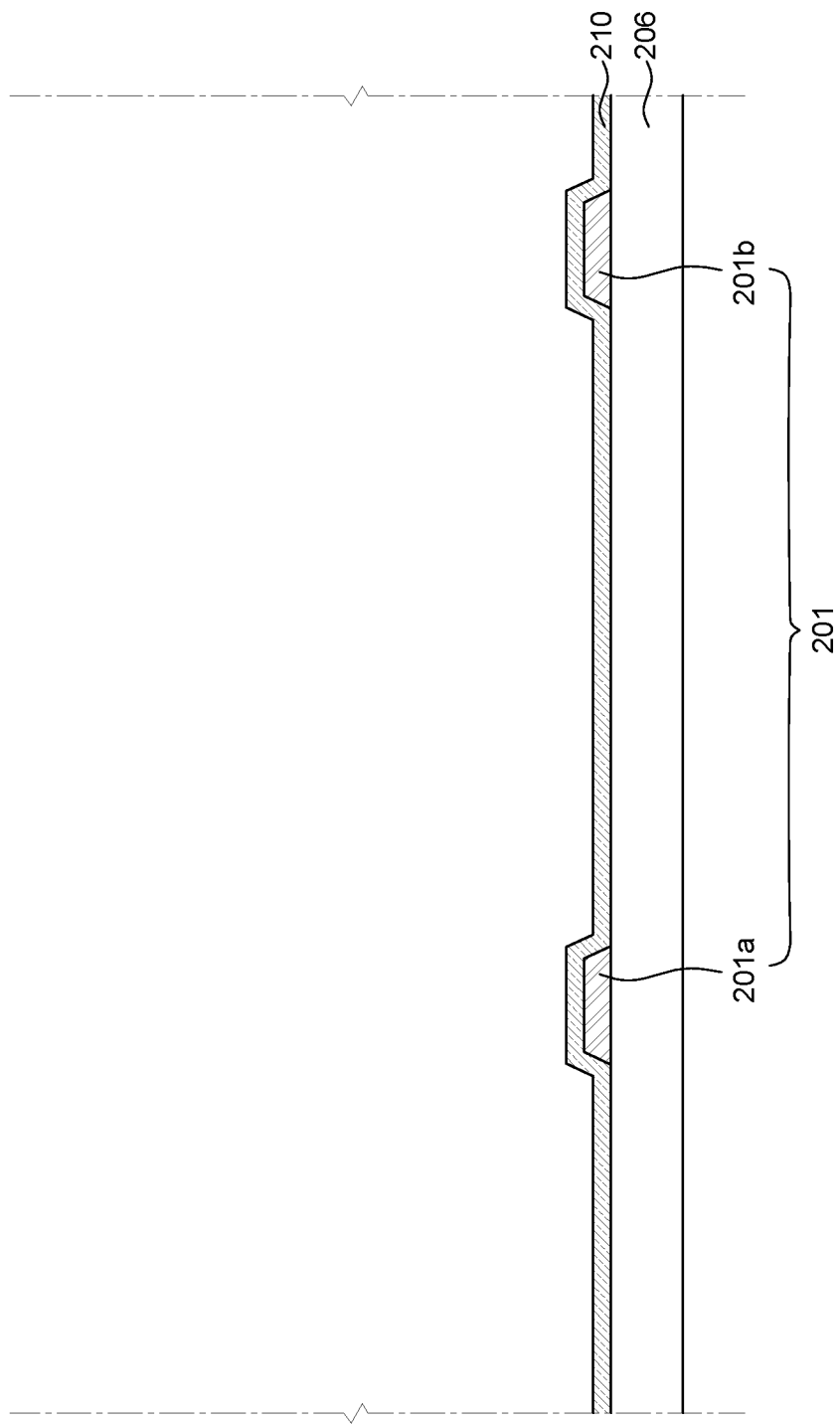

Next, as illustrated in FIG. 7B, a second conductive layer can be formed on the entire surface of the substrate 206 on which the bias line 201 can be formed and the second conductive layer formed as described above can be used as the first electrode 210.

Here, as the second conductive layer, a transparent conductive material such as indium tin oxide (ITO), indium zinc oxide (IZO), and indium tin zinc oxide (ITZO) can be used. Further, the second conductive layer can be formed to have a multi-layered structure in which two or more conductive materials are laminated.

Figure 7C:
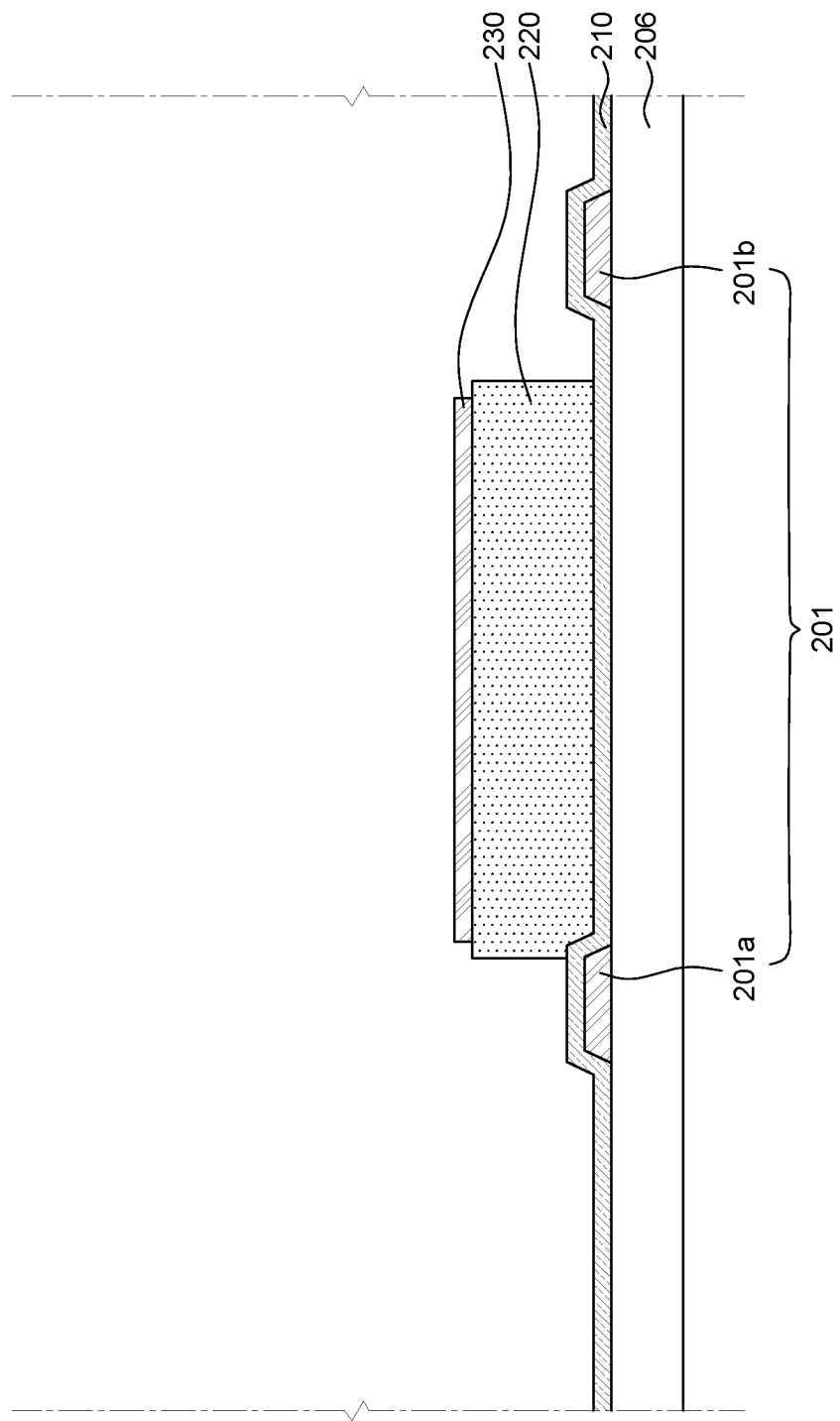

Further, as illustrated in FIG. 7C, after sequentially forming a third conductive layer and a fourth conductive layer on the entire surface of the first electrode 210, the third conductive layer and the fourth conductive layer are selectively patterned using the photolithographic process (second mask process) to form the photo diode 220 and the second electrode 230 above the first electrode 210.

In this instance, the third conductive layer can be formed as the photo diode 220 and the fourth conductive layer can be formed as the second electrode 230. The third conductive layer can be formed of a structure in which an n-type silicon layer, an intrinsic silicon layer, and a p-type silicon layer are sequentially laminated. The fourth conductive layer can be formed of a low resistance opaque conductive material such as aluminum (Al), an aluminum alloy (Al alloy), tungsten (W), copper (Cu), chrome (Cr), and molybdenum (Mo). Other materials can be used.

Additionally, a process of forming the photo diode 220 using the third conductive layer can be referred to as a first process for the sake of convenience.

Figure 7D:
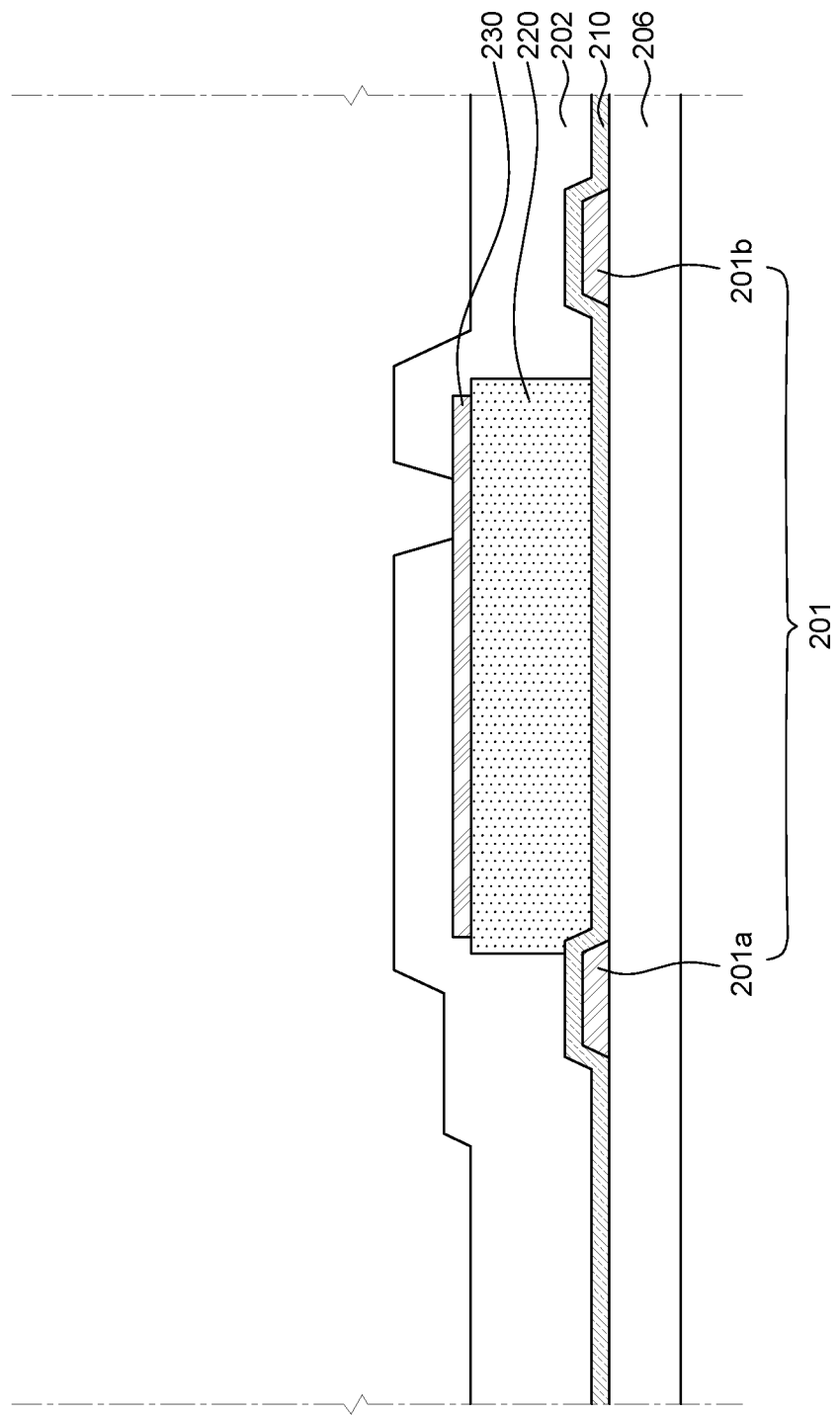

Next, as illustrated in FIG. 7D, after forming a first insulating layer formed of tetraethoxy silane (TEOS) and silicon nitride (SiNx) on the entire surface of the substrate 206 on which the first electrode 210, the photo diode 220, and the third electrode 230 are formed, the first insulating layer can be selectively patterned using a photolithographic process (third mask process) to form a contact hole which exposes a part of the second electrode 230. Here, the first insulating layer can be used as the interlayer insulating layer 202.

Figure 7E:
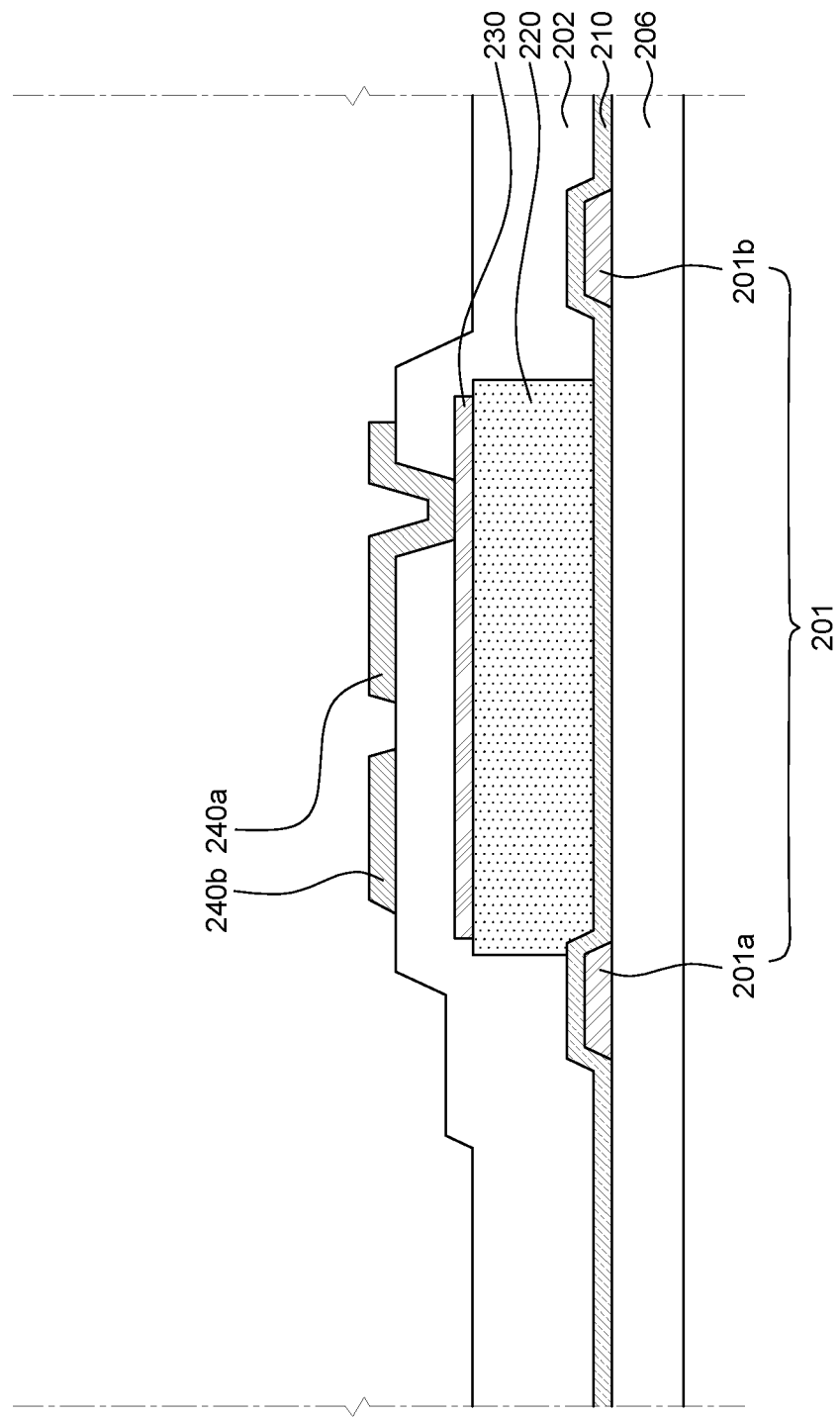

Next, as illustrated in FIG. 7E, after forming a fifth conductive layer on the entire surface of the substrate 206 on which the interlayer insulating layer 202 can be formed, the fifth conductive layer can be selectively patterned using a photolithographic process (fourth mask process) to form the source electrode 240b and the drain electrode 240a formed of the fifth conductive layer above the interlayer insulating layer 202.

In this instance, the drain electrode 240a can be electrically connected to the second electrode 230 through a contact hole of the first insulating layer.

Figure 7F:
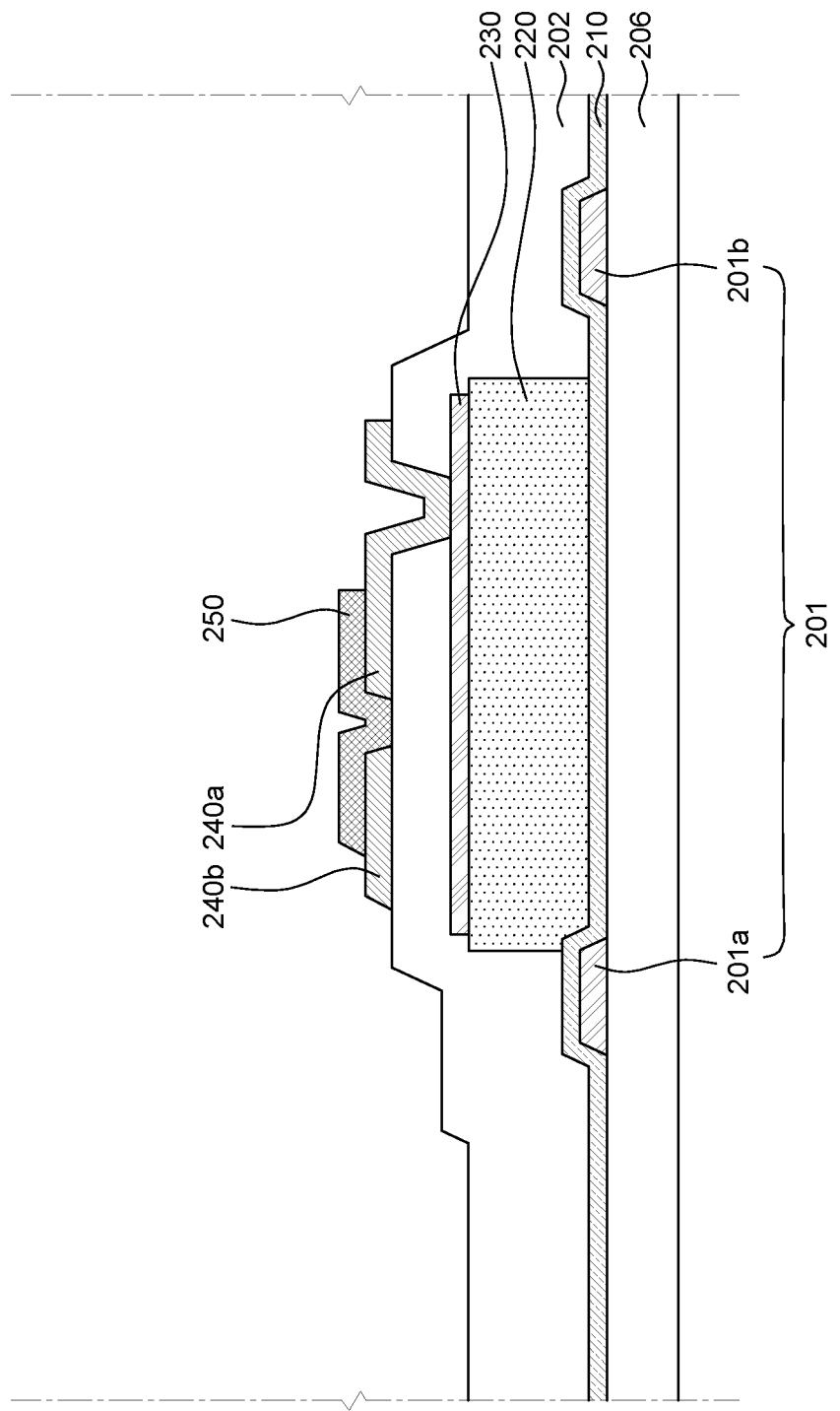

Next, as illustrated in FIG. 7F, after depositing an amorphous silicon thin film and an n+ amorphous silicon thin film on the entire surface of the substrate 206 on which the source/drain electrodes 240b and 240a and the interlayer insulating layer 202 are formed, the amorphous silicon thin film and the n+ amorphous silicon thin film are selectively patterned using a photolithographic process (fifth mask process) to form an active layer 250 formed of the amorphous silicon thin film and the n+ amorphous silicon thin film above the source/drain electrodes 240b and 240a.

Figure 7G:
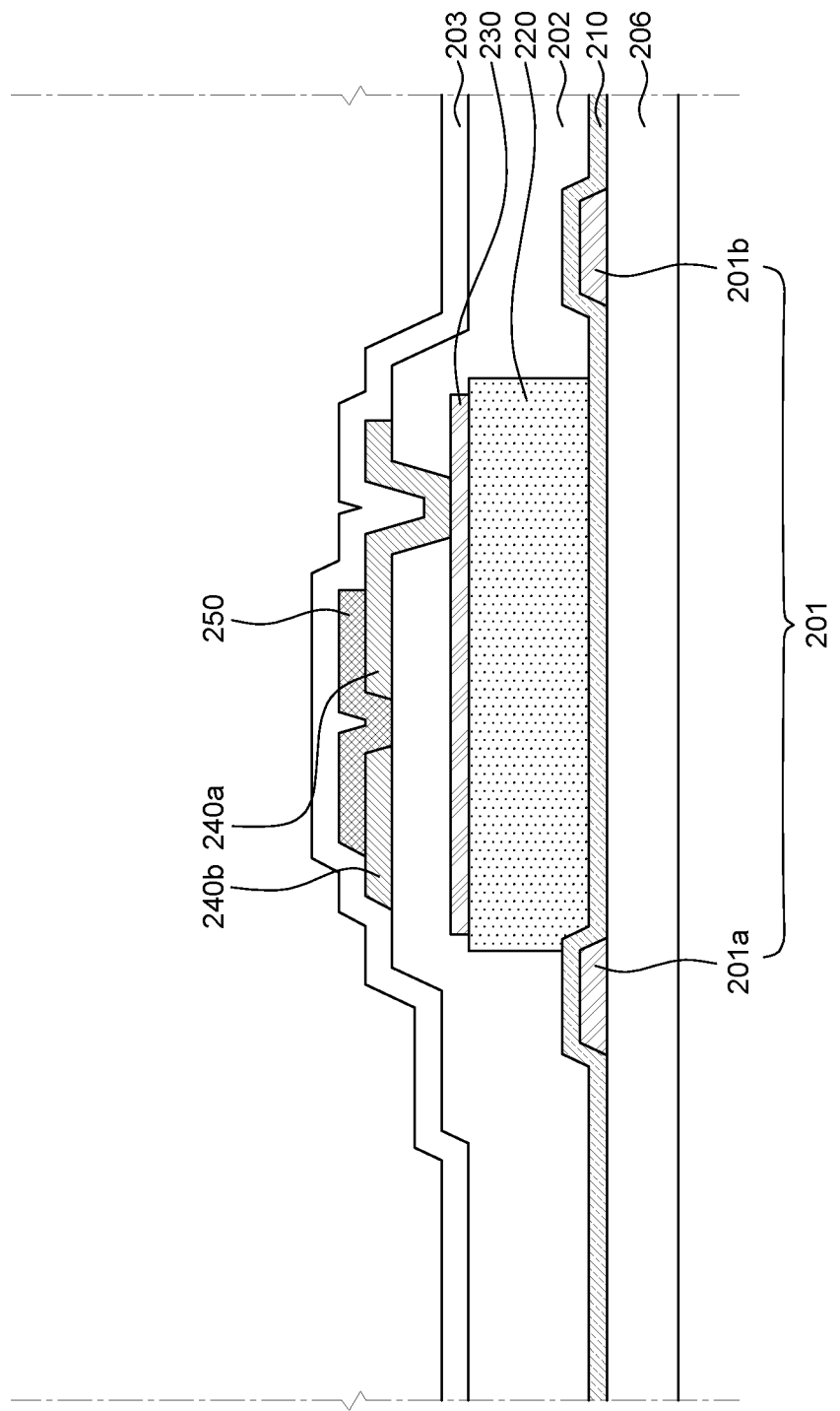

Next, as illustrated in FIG. 7G, a second insulating layer can be deposited on the entire surface of the substrate 206 on which the source/drain electrodes 240b and 240a, the active layer 250, and the interlayer insulating layer 202 are formed and the second insulating layer can be used as a gate insulating layer 203.

Figure 7H:
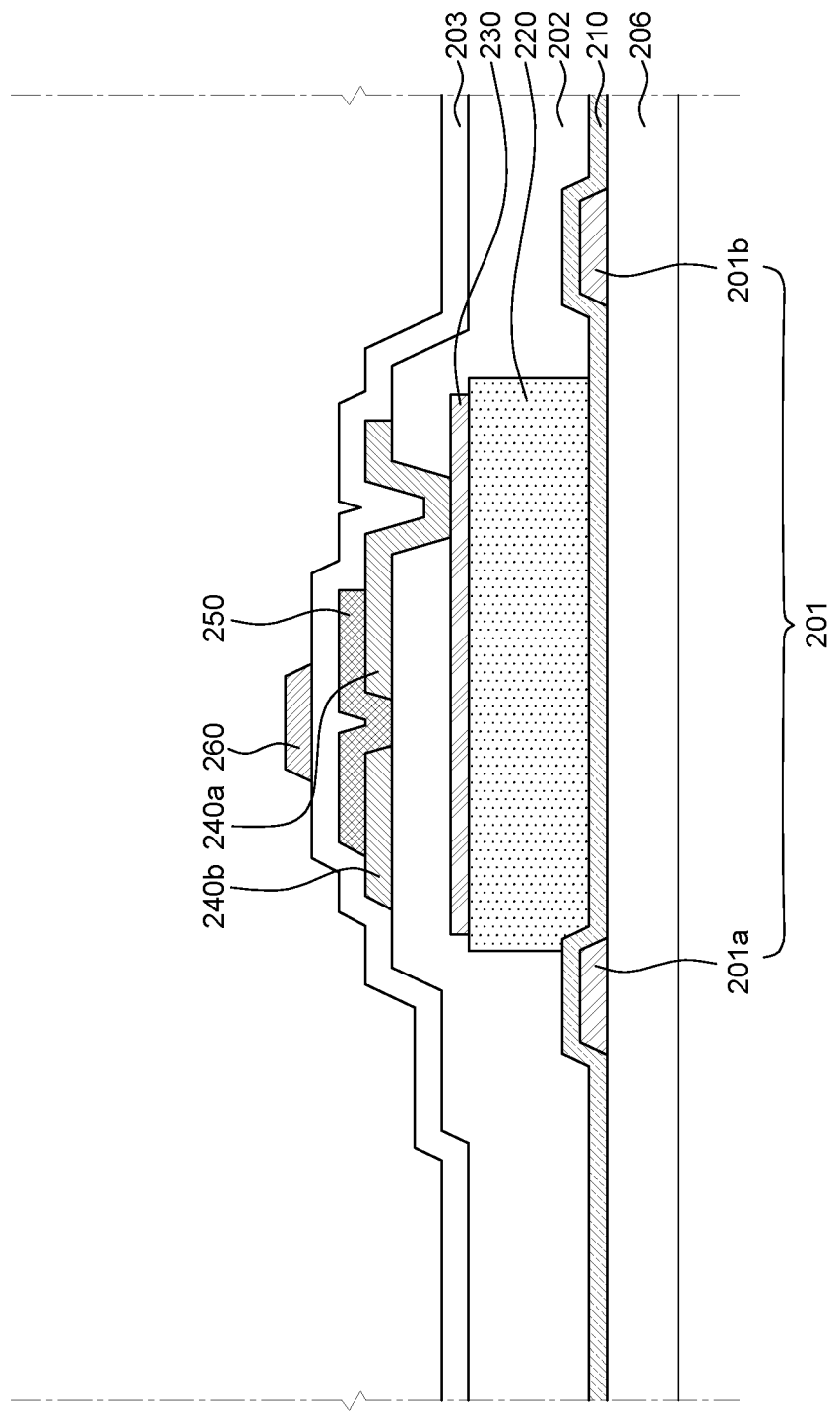

Next, as illustrated in FIG. 7H, after forming a sixth conductive layer on the entire surface of the substrate 206 on which the gate insulating layer 203 can be formed, the sixth conductive layer can be selectively patterned using a photolithographic process (sixth mask process) to generate a gate electrode 260 formed of the sixth conductive layer above the gate insulating layer 203.

In this instance, the gate electrode 260 can be formed of a low resistance conductive material such as aluminum (Al), an aluminum alloy (Al alloy), tungsten (W), copper (Cu), chromium (Cr), or molybdenum (Mo). Other materials can be used.

Additionally, the process of forming a thin film transistor including the source/drain electrodes 240b and 240a and the gate electrode 260 can be referred to as a second process for the sake of convenience.

Figure 7I:
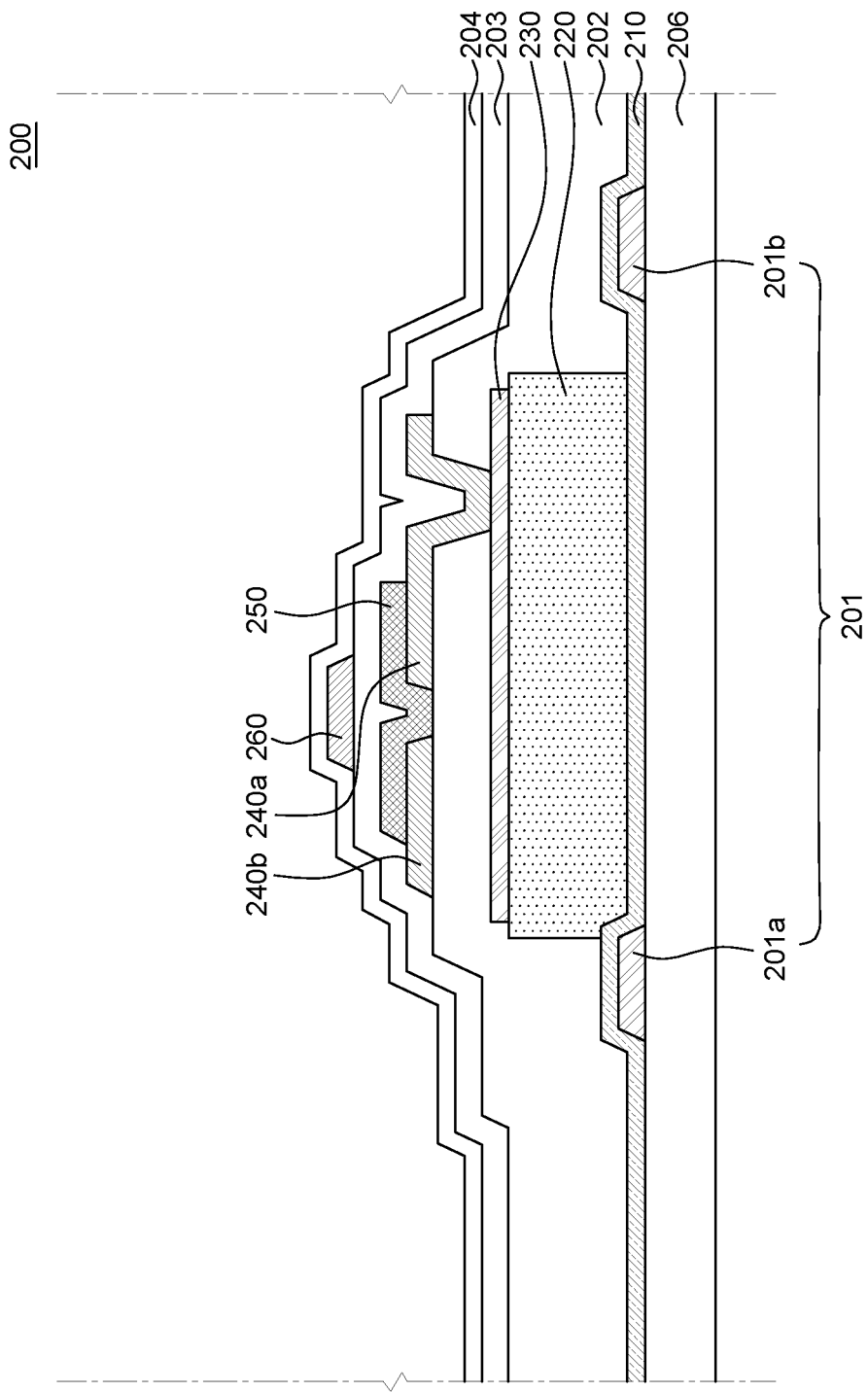

Next, as illustrated in FIG. 7I, after depositing a third insulating layer on the entire surface of the substrate 206 on which the gate insulating layer 203 and the gate electrode 260 are disposed, the third insulating layer can be selectively patterned using a photolithographic process (seventh process) to form a contact hole in a gate pad unit of the photo detecting apparatus in FIG. 7I. Here, the third insulating layer can be used as the protecting layer 204.

A process of applying a seventh conductive layer below the substrate 206 on which the protecting layer 204 can be provided can be further performed. For example, the seventh conductive layer can be formed of a transparent conductive material which can suppress scattering, such as indium tin oxide (ITO), indium zinc oxide (IZO), and indium tin zinc oxide (ITZO). The seventh conductive layer forms an anti-scattering layer.

In this instance, the process of manufacturing the anti-scattering layer can be referred to as a third process for the sake of convenience.

A process of applying a fluorescent material below the substrate 206 on which the protecting layer 204 can be provided can be further performed. The X-ray which can be incident onto the fluorescent material from the outside can be emitted as a visible ray. In this instance, the fluorescent material can be formed of a photosensitive material such as cesium iodide and gadolinium oxysulfide (Gadox). Other materials can be used. The fluorescent material forms the phosphor 270 and further forms a scintillation layer or a scintillator.

Additionally, the process of forming the phosphor 270 can be applied to the manufacturing method of a photo detecting apparatus of the present disclosure without limitation of the process order. For example, the process of forming the phosphor 270 can be applied after the second process of manufacturing the thin film transistor or the third process of manufacturing the anti-scattering layer.

As described above, the manufacturing method of a photo detecting apparatus requires seven photolithographic processes to pattern the bias line 201, the photo diode 220 and the second electrode 230, the interlayer insulating layer 202, the source/drain electrodes 240b and 240a, the active layer 250, the gate electrode 260, and the protecting layer 204.

The example embodiments of the present disclosure can also be described as follows:

According to an aspect of the present disclosure, there is provided a photo detecting apparatus. The photo detecting apparatus includes a thin film transistor array on a first surface of a substrate having a specific light transmissivity; and a photo diode structure between the first surface and the thin film transistor array. The photo diode structure is implemented to receive and process an electromagnetic radiation through a second surface of the substrate.

The photo detecting apparatus which is implemented to receive and process an electromagnetic radiation through the second surface of the substrate can have an improved incident efficiency as compared with a photo detecting apparatus which is implemented to receive and process an electromagnetic radiation through a first surface of the substrate differently from the photo detecting apparatus.

The photo detecting apparatus can further include an anti-scattering layer on the second surface of the substrate.

The photo detecting apparatus can further include one or more components which are provided on an entire surface of the photo diode structure between the photo diode structure and the substrate. Only the one or more components can be provided between the photo diode structure and the substrate.

The one or more components can include a first electrode.

The first electrode can be configured by a member having transmissivity.

The photo detecting apparatus can further include a first electrode located on the first surface of the substrate; and a bias line located between the substrate and the first electrode.

The first electrode can be configured by a member having transmissivity.

The first electrode can be provided on a first area of the substrate excluding an area where the bias line is provided, on one surface of the substrate that faces the bias line and a superficial area of the bias line excluding the first area.

The photo diode structure can be provided to be in direct contact with the first electrode.

The photo detecting apparatus can further include a second electrode located between the photo diode structure and the thin film transistor array.

The photo detecting apparatus can include one or more components which are provided on an entire surface of the second electrode between the second electrode and the substrate. Only the one or more components can be provided between the second electrode and the substrate.

The one or more components can include at least one of the photo diode structure and the first electrode.

The photo detecting apparatus can further include a phosphor on the second surface.

A planarization layer for the phosphor can be excluded for the photo detecting apparatus.

According to another aspect of the present disclosure, there is provided a photo reaction element. The photo reaction element includes a specific structure in which a specific switch is formed a specific detector after forming the specific detector on a specific substrate. A fill factor of the specific structure is improved as compared with a normal structure in which a normal detector is formed on a normal switch after forming the normal switch on a normal substrate.

The normal detector is configured by a normal photo diode, but the specific detector can be configured by a specific photo diode.

The normal switch is configured by a normal thin film transistor, but the specific switch can be configured by a specific thin film transistor.

The specific substrate can be configured by a transmissive member.

The normal detector optically reacts with an external ray which is incident onto a surface which is different from one surface of the substrate on which the normal switch is formed.

According to another aspect of the present disclosure, there is provided an X-ray detector. The X-ray detector includes a substrate; a thin film transistor on a first surface of the substrate; a photo diode between the thin film transistor and the substrate; and a phosphor on a second surface of the substrate.

The phosphor can further include a fluorescent material which reacts an X-ray entering from the outside to emit a visible ray.

A planarization layer for the phosphor can be excluded for the X-ray detector.

According to another aspect of the present disclosure, there is provided a manufacturing method of a substrate for a photo detector. The manufacturing method of a substrate for a photo detector includes a first process of forming a photo diode on a first surface of a substrate; and a second process of forming a thin film transistor on the first surface of the substrate after the first process.

The manufacturing method of a substrate for a photo detector can further include a process of forming a first electrode on an entire first surface of the substrate before the first process.

The manufacturing method of a substrate for a photo detector can further include a process of forming a bias line on the first surface of the substrate before the first process.

The manufacturing method of a substrate for a photo detector can further include a process of forming a second electrode on the first surface of the substrate between the first process and the second process.

The manufacturing method of a substrate for a photo detector can further include a third process of forming an anti-scattering layer on a second surface of the substrate after the second process.

The manufacturing method of a substrate for a photo detector can further include a process of forming a phosphor on the second surface of the substrate after the third process.

The manufacturing method of a substrate for a photo detector can further include a process of forming a phosphor on the second surface of the substrate after the second process.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A photo detecting apparatus, comprising:
a thin film transistor array including a source electrode, a drain electrode, an active layer and a gate electrode on a first surface of a substrate having a specific light transmissivity;
a photo diode structure between the first surface and the thin film transistor array, the photo diode structure being implemented to receive and process an electromagnetic radiation through a second surface of the substrate; and
a second electrode disposed on the photo diode structure, wherein the active layer of the thin film transistor array is completely overlapped with the second electrode, and
wherein the second electrode is formed of an opaque conductive material.

2. The photo detecting apparatus according to claim 1, wherein the photo detecting apparatus is implemented to receive and process an electromagnetic radiation through the second surface of the substrate, and has an improved incident efficiency as compared with a photo detecting apparatus which is implemented to receive and process an electromagnetic radiation through a first surface of the substrate differently from the photo detecting apparatus.

3. The photo detecting apparatus according to claim 1, further comprising:
an anti-scattering layer on the second surface of the substrate.

4. The photo detecting apparatus according to claim 1, further comprising:
one or more components which are provided on an entire surface of the photo diode structure between the photo diode structure and the substrate,
wherein only the one or more components are provided between the photo diode structure and the substrate.

5. The photo detecting apparatus according to claim 4, wherein the one or more components include a first electrode.

6. The photo detecting apparatus according to claim 5, wherein the first electrode is configured by a member having transmissivity.

7. The photo detecting apparatus according to claim 1, further comprising:
a first electrode located on the first surface of the substrate; and
a bias line located between the substrate and the first electrode.

8. The photo detecting apparatus according to claim 7, wherein the first electrode is configured by a member having transmissivity.

9. The photo detecting apparatus according to claim 7, wherein the first electrode is provided on a first area of the substrate excluding an area where the bias line is provided on one surface of the substrate that faces the bias line and a surface area of the bias line excluding the first area.

10. The photo detecting apparatus according to claim 7, wherein the photo diode structure is provided to be in direct contact with the first electrode.

11. The photo detecting apparatus according to claim 1, wherein the second electrode is located between the photo diode structure and the thin film transistor array.

12. The photo detecting apparatus according to claim 1, further comprising:
one or more components which are provided on an entire surface of the second electrode between the second electrode and the substrate,
wherein only the one or more components are provided between the second electrode and the substrate.

13. The photo detecting apparatus according to claim 12, wherein the one or more components include at least one of the photo diode structure and the first electrode.

14. The photo detecting apparatus according to claim 1, further comprising:
a phosphor on the second surface.

15. The photo detecting apparatus according to claim 14, wherein a planarization layer for the phosphor is excluded.

\* \* \* \* \*